United States Patent
Satyavolu et al.

(10) Patent No.: US 10,152,331 B2
(45) Date of Patent: Dec. 11, 2018

(54) METHOD AND SYSTEM FOR ENFORCING KERNEL MODE ACCESS PROTECTION

(71) Applicant: Wind River Systems, Inc., Alameda, CA (US)

(72) Inventors: Surya Satyavolu, Alameda, CA (US); Thierry Preyssler, Alameda, CA (US)

(73) Assignee: WIND RIVER SYSTEMS, INC., Alameda, CA (US)

( * ) Notice: Subject to any disclaimer, the term of this patent is extended or adjusted under 35 U.S.C. 154(b) by 830 days.

(21) Appl. No.: 14/280,021

(22) Filed: May 16, 2014

(65) Prior Publication Data
US 2015/0331809 A1 Nov. 19, 2015

(51) Int. Cl.
| | |
|---|---|
| *G06F 9/445* | (2018.01) |
| *G06F 9/4401* | (2018.01) |
| *G06F 9/26* | (2006.01) |
| *G06F 9/54* | (2006.01) |
| *G06F 12/02* | (2006.01) |
| *G11C 7/10* | (2006.01) |

(52) U.S. Cl.
CPC ............ *G06F 9/4406* (2013.01); *G06F 9/261* (2013.01); *G06F 9/4401* (2013.01); *G06F 9/44557* (2013.01); *G06F 9/545* (2013.01); *G06F 12/023* (2013.01); *G11C 7/1072* (2013.01); *G06F 2212/1044* (2013.01); *G06F 2212/1052* (2013.01)

(58) Field of Classification Search
CPC . G06F 12/14; G06F 9/26; G06F 9/261; G06F 9/44; G06F 9/4401; G06F 9/445; G06F 9/44557; G06F 9/54; G06F 9/545; G06F 12/02; G06F 12/023; G06F 21/00; G06F 2212/1044; G06F 2212/1052; G11C 7/10; G11C 7/1072
USPC ............................................. 713/2; 711/163
See application file for complete search history.

(56) References Cited

U.S. PATENT DOCUMENTS

| | | | |
|---|---|---|---|
| 2003/0037178 A1 | 2/2003 | Vessey et al. | |
| 2004/0210760 A1 | 10/2004 | McGrath et al. | |
| 2006/0277233 A1* | 12/2006 | Miller | G06F 15/02 708/160 |
| 2007/0073995 A1* | 3/2007 | Rudelic | G06F 21/575 711/202 |
| 2009/0063799 A1* | 3/2009 | Berenbaum | G06F 12/1441 711/163 |
| 2012/0096252 A1* | 4/2012 | Arditti | G06F 9/4406 713/2 |
| 2013/0132702 A1* | 5/2013 | Patel | G06F 12/08 711/202 |
| 2013/0151849 A1* | 6/2013 | Graham | H04L 9/32 713/164 |
| 2014/0108761 A1 | 4/2014 | Escandell et al. | |

* cited by examiner

*Primary Examiner* — Nitin C Patel
(74) *Attorney, Agent, or Firm* — Fay Kaplun & Marcin, LLP

(57) ABSTRACT

A non-transitory computer-readable storage medium storing a set of instructions executable by a processor, the set of instructions, when executed by the processor, causing the processor to perform operations including mapping a memory area storing a segment of code for a kernel of the system during an initialization time of a system. The operations also include executing the segment of code during the initialization time. The operations also include unmapping a portion of the memory area for the kernel after the segment of code has been executed.

20 Claims, 3 Drawing Sheets

METHOD AND SYSTEM FOR ENFORCING KERNEL MODE ACCESS PROTECTION

BACKGROUND

Microkernels provide a minimal amount of software to be part of a kernel that executes in privileged mode of a processor. A microkernel leaves some aspects of a typical operating system, such as device drivers, to user-space processes, rather than including them as part of the kernel. Microkernels are generally thought of as more secure than standard kernels because their smaller size provides less area to be vulnerable to malicious software. However, any malicious software, such as a rootkit, that gains access to a microkernel will have complete control over all system memory.

SUMMARY OF THE INVENTION

A non-transitory computer-readable storage medium stores a set of instructions executable by a processor. The set of instructions, when executed by the processor, causes the processor to perform operations including mapping a memory area storing a segment of code for a kernel of the system during an initialization time of a system. The operations also include executing the segment of code during the initialization time. The operations also include unmapping a portion of the memory area for the kernel after the segment of code has been executed.

A system includes a data storage storing a set of instructions. The system also includes a processor executing the instructions to perform operations including mapping a memory area storing a segment of code for a kernel of the system during an initialization time of the system. The operations also include executing the segment of code during the initialization time. The operations also include unmapping a portion of the memory area for the kernel after the segment of code has been executed.

A method includes mapping a memory area storing a segment of code for a kernel of the computing system during an initialization time of a computing system. The method also includes executing the segment of code during the initialization time. The method also includes unmapping a portion of the memory area for the kernel after the segment of code has been executed.

DETAILED DESCRIPTION

Figure 1:
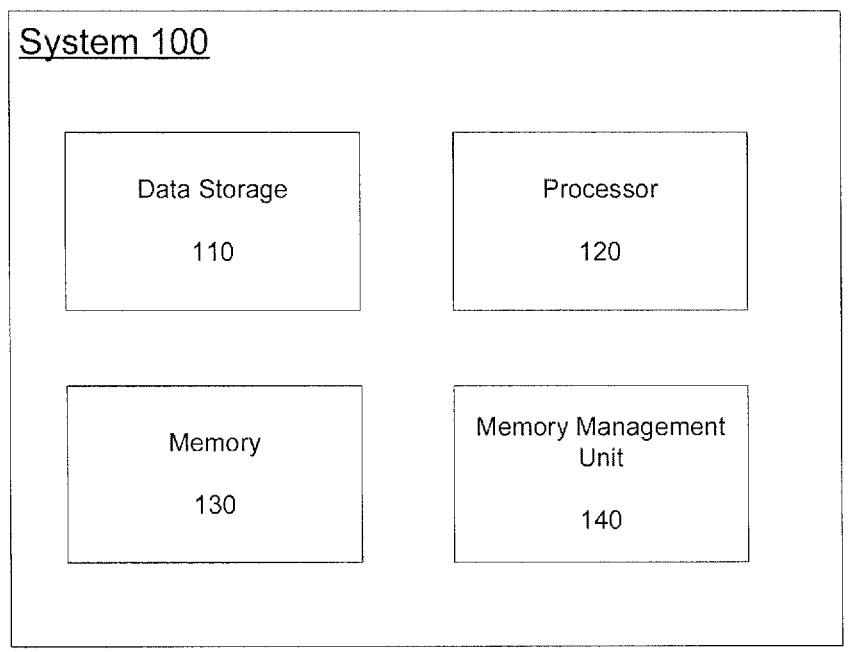
FIG. 1 schematically illustrates a computing system using a microkernel that is protected according to an exemplary embodiment.

The exemplary embodiments may be further understood with reference to the following description and the related appended drawings, wherein like elements are provided with the same reference numerals. Specifically, the exemplary embodiments relate to methods and systems for improving the security of an operating system kernel against malware such as rootkits.

Microkernel architecture provides a near-minimum amount of software to be part of a kernel that executes in privileged (e.g., supervisor) mode of a processor. A microkernel may typically include low-level address space management, thread management, and inter-process communication, while leaving other aspects of a typical operating system, such as device drivers, to user-space processes. Microkernels are generally thought of as more secure than monolithic kernels, simply because their smaller size provides less area to be vulnerable to malicious software, such as rootkits. As a result, it is typically easier to provide greater security assurances for a smaller kernel, such as a microkernel, than for a larger kernel.

Design efforts for existing microkernels, such as QNX or Minix, have focused on minimizing the size of the runtime executable. In, for example, the QNX microkernel, while user space processes have memory protections, in kernel mode all memory is mapped with full (read/write/execute, commonly abbreviated "RWX") access privileges even at runtime. Thus, however small the kernel may be, any malicious software, such as a rootkit, that gains supervisor privileges and access to the kernel will have complete control over all the memory. Thus, while the memory mapping of the QNX microkernel protects the operating system and various applications from one another, no defense is provided against kernel-mode malware, such as rootkits.

FIG. 1 schematically illustrates a system 100 including a kernel that may be protected from malware such as rootkits by the exemplary embodiments. Though the exemplary embodiments are particularly suited for a system using a microkernel for the reasons discussed above, they are equally applicable to a system using any other type of kernel. Therefore, the exemplary embodiments will be described with reference to the generalized term "kernel," and those of skill in the art will understand that this description encompasses a microkernel as described above. The system 100 includes data storage 110 (e.g., a hard drive, flash drive, or other storage mechanism) storing software, program data, and other data that may typically be stored in a permanent storage of a computing device. The system 100 also includes processor 120, which may be any type of microprocessor known in the art and capable of executing an operating system (e.g., a microkernel operating system) and other software. The system 100 also includes a memory 130 (e.g., random-access memory) used in the active execution of software in the typical manner that is known to those of skill in the art.

The system 100 also includes a memory management unit ("MMU") 140. In the exemplary embodiments, the MMU 140 is used to provide additional access protections inside the kernel. Specifically, the MMU 140 will unmap the initialization section of the kernel that does supervisor mode address-space management. That is, since the kernel does not do any dynamic page management of kernel-mode memory at runtime, there is no need to have supervisor mode access after initialization. By unmapping these memory areas after initialization from the point of view of the kernel, there are fewer vulnerable areas for kernel mode attacks during runtime. The MMU 140 also maps other parts of the runtime kernel with the minimum needed set of access permissions to further reduce the surface of vulnerability of the kernel at runtime. For example, large parts of the kernel are non-modifiable (read only) and the text part of kernel memory may have execute permission only. The MMU 140 may also not provide any access to the supervisor mode address management code, thereby preventing attempts to remap the kernel MMU. The following provides an exemplary description of the operation of the system 100 to provide this described functionality.

Those skilled in the art will understand that MMU 140 is typically implemented as a hardware component executing firmware or other types of instructions. The hardware component may be a portion of the processor 120 or may also be implemented as a separate integrated circuit in communication with the processor 120.

Figure 2:
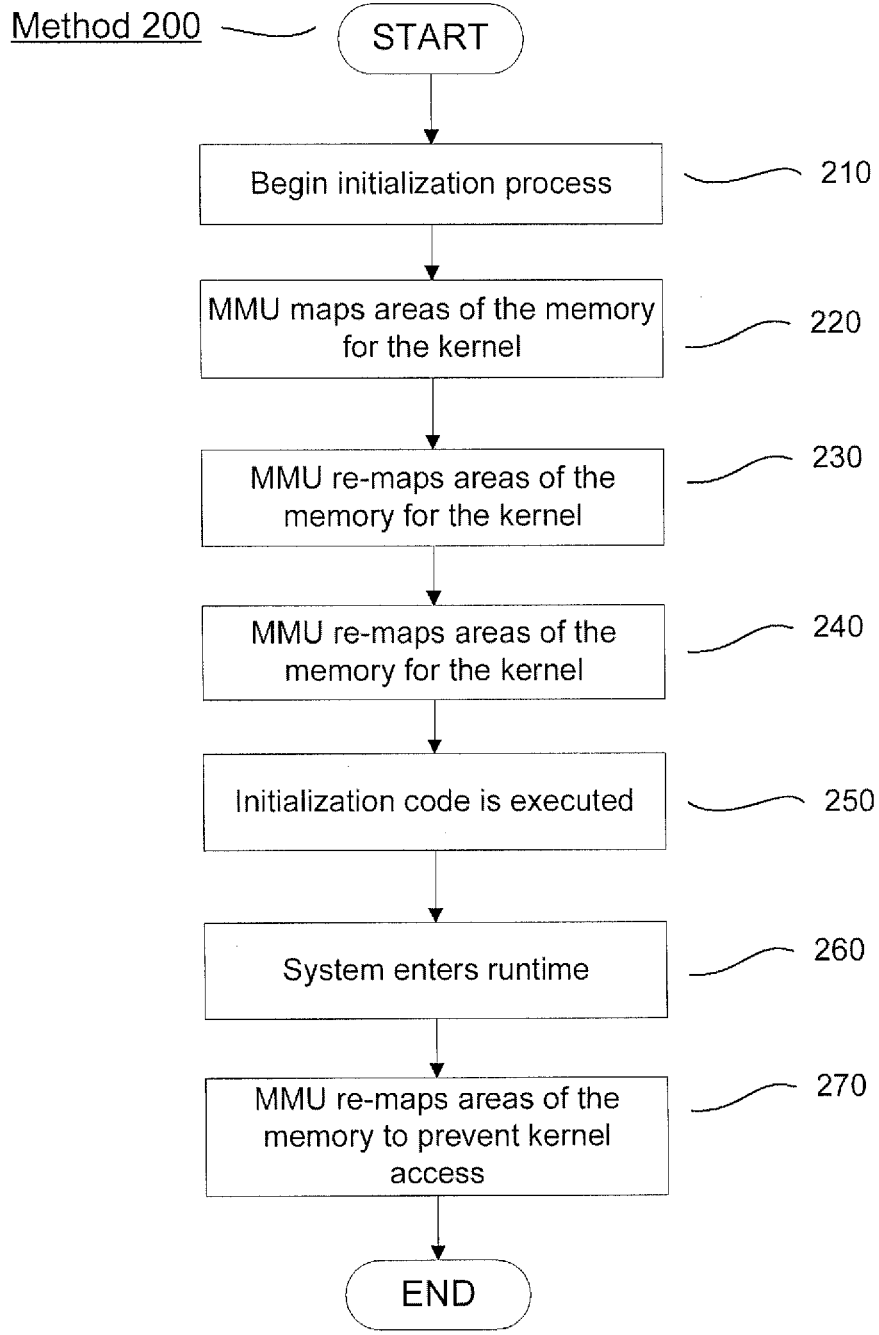
FIG. 2 shows a memory mapping process for protecting a microkernel system such as the system of FIG. 1 from malware according to an exemplary embodiment.
Figure 3:
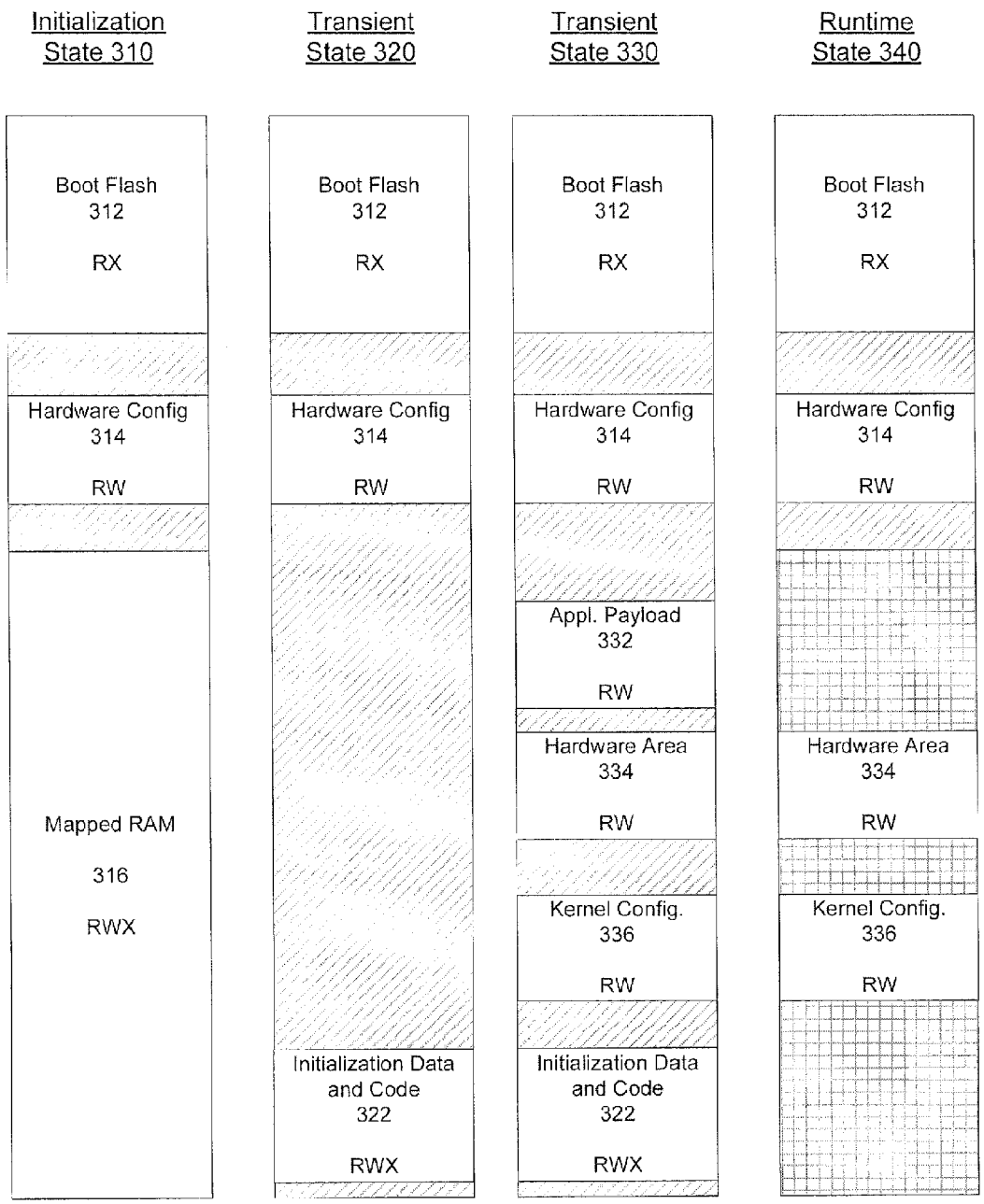
FIG. 3 shows maps of a memory area of a system such as the exemplary system of FIG. 1 at various stages during the performance of the exemplary method of FIG. 2.

FIG. 2 illustrates an exemplary method 200 for memory mapping and unmapping during initialization of the exemplary system 100 of FIG. 1 in order to protect the system 100 from rootkits or other kernel-mode malware as described above. FIG. 3 shows contents of the memory 130 of the system 100 at various stages during the performance of the method 200. FIGS. 2 and 3 will be described hereinafter in conjunction with one another.

FIG. 3 includes the memory 130 at an initialization stage 310, a transient state 320, a second transient state 330, and a runtime state 340 of the system 100. In the various states shown in FIG. 3, areas of the memory 130 that are mapped and accessible by the kernel are designated using a white background, areas of the memory 130 that are unmapped from the perspective of the kernel are designated using diagonal hatching, and areas of the memory 130 that may be mapped for virtual hardware or other purposes and are unmapped from the perspective of the kernel are designated using crosshatching. It will be apparent to those of skill in the art that the precise locations of the various areas in the memory 130 shown in FIG. 3 are only exemplary and that these locations may vary in other embodiments. The segments of memory shown in FIG. 3 also include the permission status that the kernel has for the various areas; it will be apparent to those of skill in the art that "RX" indicates read and execute permissions, "RW" indicates read and write permissions, and "RWX" indicates read, write and execute permissions.

In step 210, the initialization process for the system 100 is initiated. This may occur due to any prompting known in the art, such as a user initiating the system 100 or the system 100 being initiated due to an automated process. In step 220, the MMU 140 maps portions of the memory 130 to be accessed by the kernel. At this point, the state of the memory 130 of the system is shown in initialization state 310 of FIG. 3. The mapped areas of the memory 130 include boot flash area 312, hardware configuration area 314, and mapped RAM 316. The remainder of the memory 130 is unmapped for the kernel. As can be seen from FIG. 3, in the initialization state 310, large portions of the memory are mapped for the kernel because kernel mode address space management is needed during initialization. At this time, the MMU 140 would not enforce access protections on the different memory sections, but gives the kernel full permission to modify or execute any part of the kernel.

In step 230, the MMU 140 re-maps the memory 130 as part of the initialization process. This re-mapping results in the memory 130 as shown in the transient state 320 of FIG. 3. The memory 130 continues to include boot flash area 312 and hardware configuration area 314, and also includes initialization data/initialization code 322, a grouping that includes both initialization code and initialization data.

In step 240, the MMU 140 again re-maps the memory 130 as part of the initialization process. This re-mapping adds further portions of the memory 130 to the area that is mapped for the kernel. These added areas may be used to accomplish the initialization of the system 100. Initialization code is already resident in the memory 130; thus, the re-mapping of step 240 results in the memory 130 as shown in the transient state 330 of FIG. 3. The memory 130 continues to include boot flash area 312, hardware configuration area 314, and initialization data/initialization code 322, and also includes application payload 332, hardware area 334 and kernel configuration data 336, which are loaded into memory 130 as part of the initialization of system 100. It will be apparent to those of skill in the art that these specific memory areas are only exemplary and that the specific contents that may be loaded into memory 130 will vary for different implementations of a system or a kernel.

In step 250, the initialization code for the system 100 that was mapped for the kernel in step 240 is executed. It will be apparent to those of skill in the art that specific aspects of this step may vary among different implementations of a kernel (or microkernel) and a system 100, and may, in some exemplary embodiments, be substantially similar to the execution of initialization code that is known in the art. In step 260, the system 100 enters the runtime phase of its operations.

In step 270, the MMU 140 of the system 100 performs a further re-mapping step to un-map portions of the memory 130 from the perspective of the kernel. The re-mapping of step 270 results in the memory 130 as shown in the runtime state 340 of FIG. 3. The memory 130 continues to include boot flash area 312, hardware configuration area 314, hardware area 334 and kernel configuration data 336. However, application payload 332 and initialization data/initialization code 322 are no longer mapped in the kernel memory 130, and the areas of the memory 130 that stored them, along with the remainder of the memory not devoted to boot flash area 312, hardware configuration area 314, hardware area 334 and kernel configuration data 336, are unmapped from the perspective of the kernel. Following step 270, the runtime phase of operations follows in the manner that is commonly known in the art, and the method 200 terminates. Subsequent to the termination of the method 200, areas of the memory 130 that have been unmapped from the perspective of the kernel may be mapped by the MMU 140 for another use, such as for mapping virtual computing environments such as virtual boards.

The exemplary embodiments described above enable a microkernel, or other kernel, to be constructed, in such a manner that kernel-mode malware, such as a rootkit, does not gain access to the entirety of a system's memory by gaining access to the kernel. As discussed above, this may be accomplished by unmapping memory areas not required by the kernel during runtime after they have been used by the kernel as needed during system initialization. The system may then function as normal during runtime. As a result, the security of microkernels and other kernels may be enhanced.

Those of skill in the art will understand that the above-described exemplary embodiments may be implemented in any number of matters, including as a software module, as a combination of hardware and software, etc. For example, the exemplary method 200 may be embodied in a program stored in a non-transitory storage medium and containing lines of code that, when compiled, may be executed by a processor.

It will be apparent to those skilled in the art that various modifications may be made to the exemplary embodiments, without departing from the spirit or the scope of the invention. Thus, it is intended that the present invention cover modifications and variations of this invention provided they come within the scope of the appended claims and their equivalents.

What is claimed is:

1. A non-transitory computer-readable storage medium storing a set of instructions executable by a processor, the set of instructions, when executed by the processor, causing the processor to perform operations comprising:
during an initialization time of a system, mapping a memory area storing a segment of code for a kernel of the system;
during the initialization time, executing the segment of code; and
after the segment of code has been executed, unmapping a portion of the memory area for the kernel,
wherein the segment of code is stored in the portion of the memory area that is unmapped in the unmapping step, and
wherein the segment of code comprises an application payload.

2. The non-transitory computer-readable storage medium of claim 1, wherein the kernel is a microkernel.

3. The non-transitory computer-readable storage medium of claim 1, wherein the memory area comprises random access memory.

4. The non-transitory computer-readable storage medium of claim 1, wherein the segment of code comprises initialization code.

5. The non-transitory computer-readable storage medium of claim 1, wherein the memory area further stores a further segment of code, and wherein the further segment of code is stored in a further portion of the memory area that is not unmapped in the unmapping step.

6. The non-transitory computer-readable storage medium of claim 5, wherein the segment of code comprises initialization data.

7. The non-transitory computer-readable storage medium of claim 5, wherein the further segment of code comprises one of kernel configuration data and hardware configuration data.

8. The non-transitory computer-readable storage medium of claim 1, further comprising:
after mapping the portion of the memory area for the kernel, mapping the portion of the memory area for a virtual computing environment.

9. The non-transitory computer-readable storage medium of claim 1, wherein the operations are performed by a memory management unit.

10. A system, comprising:
a data storage storing a set of instructions; and
a processor executing the instructions to perform operations comprising:
during an initialization time of the system, mapping a memory area storing a segment of code for a kernel of the system;
during the initialization time, executing the segment of code; and
after the segment of code has been executed, unmapping a portion of the memory area for the kernel,
wherein the segment of code is stored in the portion of the memory area that is unmapped in the unmapping step, and
wherein the segment of code comprises an application payload.

11. The system of claim 10, wherein the kernel is a microkernel.

12. The system of claim 10, wherein the memory area comprises random access memory.

13. The system of claim 10, wherein the segment of code comprises initialization code.

14. The system of claim 10, wherein the memory area further stores a further segment of code, and wherein the further segment of code is stored in a further portion of the memory area that is not unmapped in the unmapping step.

15. The system of claim 14, wherein the segment of code comprises initialization data.

16. The system of claim 14, wherein the further segment of code comprises one of kernel configuration data and hardware configuration data.

17. The system of claim 10, wherein the operations further comprise:
after unmapping the portion of the memory area for the kernel, mapping the portion of the memory area for a virtual computing environment.

18. The system of claim 10, further comprising:
a memory management unit,
wherein the memory management unit performs the mapping and unmapping steps.

19. A method, comprising:
during an initialization time of a computing system, mapping a memory area storing a segment of code for a kernel of the computing system;
during the initialization time, executing the segment of code; and
after the segment of code has been executed, unmapping a portion of the memory area for the kernel,
wherein the segment of code is stored in the portion of the memory area that is unmapped in the unmapping step, and
wherein the segment of code comprises an application payload.

20. The method of claim 19, wherein the memory area further stores a further segment of code, and wherein the further segment of code is stored in a further portion of the memory area that is not unmapped in the unmapping step.

* * * * *